United States Patent

Kurihara et al.

(10) Patent No.: US 9,269,744 B2
(45) Date of Patent: Feb. 23, 2016

(54) MANUFACTURING METHOD OF SOLID-STATE IMAGING APPARATUS

(71) Applicant: CANON KABUSHIKI KAISHA, Tokyo (JP)

(72) Inventors: Masaki Kurihara, Koza-gun (JP); Daisuke Shimoyama, Aiko-gun (JP); Masataka Ito, Chigasaki (JP)

(73) Assignee: Canon Kabushiki Kaisha, Tokyo (JP)

(*) Notice: Subject to any disclaimer, the term of this patent is extended or adjusted under 35 U.S.C. 154(b) by 60 days.

(21) Appl. No.: 14/148,077

(22) Filed: Jan. 6, 2014

(65) Prior Publication Data

US 2014/0199802 A1   Jul. 17, 2014

(30) Foreign Application Priority Data

Jan. 16, 2013 (JP) ................. 2013-005543

(51) Int. Cl.
 *H01L 21/00* (2006.01)
 *H01L 27/146* (2006.01)

(52) U.S. Cl.
 CPC .... *H01L 27/14685* (2013.01); *H01L 27/14621* (2013.01); *H01L 27/14627* (2013.01)

(58) Field of Classification Search
 USPC .......................................... 438/70
 See application file for complete search history.

(56) References Cited

U.S. PATENT DOCUMENTS 8,198,693 B2   6/2012  Mizuno
2009/0121371 A1*  5/2009  Kawasaki ............... 264/2.7

FOREIGN PATENT DOCUMENTS

JP     2010-199258 A    9/2010

OTHER PUBLICATIONS

Kurihara et al., U.S. Appl. No. 14/148,063, filed Jan. 6, 2014.
Kurihara et al., U.S. Appl. No. 14/147,279, filed Jan. 3, 2014.

* cited by examiner

*Primary Examiner* — Mary Wilczewski
*Assistant Examiner* — Erik T Peterson
(74) *Attorney, Agent, or Firm* — Fitzpatrick, Cella, Harper & Scinto

(57) ABSTRACT

To realize simplification of a process of forming hollow portions in a solid-state imaging apparatus, a plurality of light receiving portions is formed on a semiconductor substrate, and color filter layers as hollow portion forming layers are formed above the semiconductor substrate (FIG. 1A). A sealable layer for opening boundary portions of the color filter layers is formed on the color filter layers (FIG. 1B). Hollow portions are formed on side surfaces of the color filter layer by etching using the sealable layer as a mask (FIG. 1C). The sealable layer is heated and softened to connect mutually adjacent sealable layers to form a sealing layer for sealing the aperture regions of the hollow portions (FIG. 1D).

12 Claims, 5 Drawing Sheets

MANUFACTURING METHOD OF SOLID-STATE IMAGING APPARATUS

BACKGROUND OF THE INVENTION

1. Field of the Invention

The present invention relates to a manufacturing method of a solid-state imaging apparatus (solid-state imaging device) such as a CCD sensor and a CMOS sensor.

2. Description of the Related Art

A technique for improving the light collecting efficiency of receiving portions, particularly, a technique of more efficiently collecting light with a steep incident angle, is desired in a solid-state imaging apparatus. For example, a solid-state imaging apparatus is proposed in recent years, wherein hollow portions are formed in regions equivalent to the surrounding of the light receiving portions, and reflection of hollow portion interfaces is used to improve the light collecting efficiency of the light receiving portions (for example, Japanese Patent Application Laid-Open No. 2010-199258).

Specifically, Japanese Patent Application Laid-Open No. 2010-199258 describes the formation of the hollow portions, wherein a resist for opening hollow portion forming regions is formed on an insulation layer in which the hollow portions are formed, and aperture portions are formed on the insulation layer by dry etching using the resist as a mask. After the resist is removed, a protective film is formed on the insulation layer to seal the aperture portions by the protective film to form the hollow portions.

However, the method of Japanese Patent Application Laid-Open No. 2010-199258 has a problem that the formation process of the hollow portions is complicated.

The present invention has been made in view of the problem, and an object of the present invention is to provide a manufacturing method of a solid-state imaging apparatus that realizes simplification of a process of forming hollow portions in the solid-state imaging apparatus.

SUMMARY OF THE INVENTION

According to an aspect of the present invention, a manufacturing method of a solid-state imaging apparatus having a semiconductor substrate having a plurality of light receiving portions, comprises: forming a hollow portion forming layer above the semiconductor substrate; forming a sealable layer having an aperture above the hollow portion forming layer; forming a hollow portion in the hollow portion forming layer at a portion thereof above a position between ones of the plurality of light receiving portions; and heating the sealable layer, to form a sealing layer sealing an aperture region of the hollow portion.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment

A first embodiment of the present invention will be described.

FIGS. 1A to 1E are schematic diagrams illustrating an example of a manufacturing method of a solid-state imaging apparatus (solid-state imaging device) according to the first embodiment of the present invention.

Figure 1A:
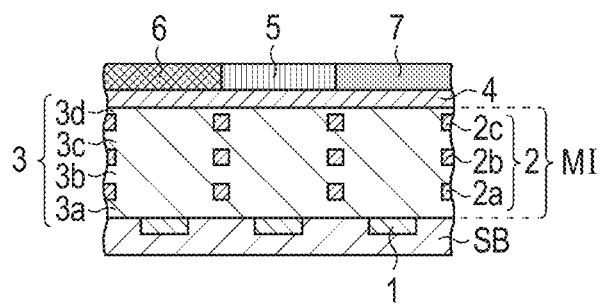
FIGS. 1A, 1B, 1C, 1D and 1E are schematic diagrams illustrating an example of a manufacturing method of a solid-state imaging apparatus (solid-state imaging device) according to a first embodiment of the present invention.

FIG. 1A will be described.

First, a plurality of light receiving portions 1 is formed on a surface (upper surface) of a semiconductor substrate SB in a two-dimensional matrix, for example. The semiconductor substrate SB is, for example, a silicon substrate, and the light receiving portions 1 are, for example, photoelectric conversion elements (photodiodes).

A multi-layer wiring structure MI is formed on the semiconductor substrate SB. The multi-layer wiring structure MI is created by, for example, sequentially forming a first interlayer insulation layer 3a, a first wiring layer 2a, a second interlayer insulation layer 3b, a second wiring layer 2b, a third interlayer insulation layer 3c, a third wiring layer 2c and a fourth interlayer insulation layer 3d on the semiconductor substrate SB. Although the upper surface of the fourth interlayer insulation layer 3d is planarized in the example illustrated in FIG. 1A, the upper surface may not be planarized. The first to fourth interlayer insulation layers 3a to 3d will be collectively called "interlayer insulation layers 3", and the first to third wiring layers 2a to 2c will be collectively called "wiring layers 2". The wiring layers 2 may be formed by so-called damascene (method of forming grooves on the undercoat interlayer insulation layers 3 and embedding metal layers as the wiring layers 2 in the grooves) or by so-called etching (method of forming metal layers on the undercoat interlayer insulation layers 3 and forming a pattern by etching the metal layers). The interlayer insulation layers 3 are formed by an inorganic material such as silicon oxide, silicon nitride and silicon oxynitride. In the present embodiment, the interlayer insulation layers 3 are formed by silicon oxide.

A first planarized layer 4 is formed on the multi-layer wiring structure MI. The first planarized layer 4 is formed by, for example, an organic material such as acrylic resin.

Photolithography is used to form a first color filter layer 5, a second color filter layer 6 and a third color filter layer 7 on the first planarized layer 4. The color filter layers 5 to 7 are arranged corresponding to the light receiving portions 1 above the light receiving portions 1, and the color filter layers 5 to 7 are formed by, for example, an organic material such as acrylic resin. Although the color filter layers 5 to 7 have substantially the same film thickness in the example illustrated in FIG. 1A, the film thickness may be different. The color filter layers may be so-called primary color filter layers or may be so-called complementary color filter layers. The arrangement of the color filter layers is not limited to the format illustrated in FIG. 1, and for example, a Bayer arrangement may be adopted.

Figure 1D:
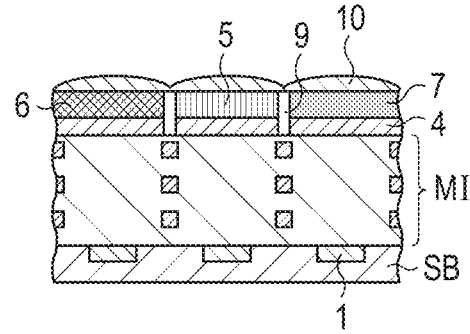
Figure 1B:
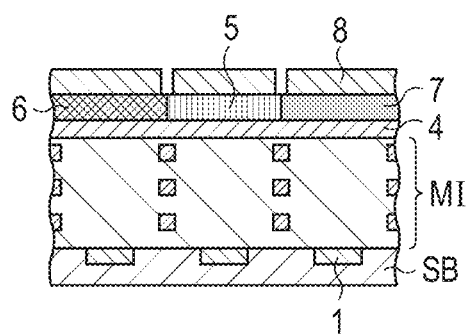

A sealable layer 8 for opening boundary portions of the color filter layers 5 to 7 is formed on the color filter layers 5 to 7 as illustrated in FIG. 1B. More specifically, the sealable layer 8 is formed on the color filter layers 5 to 7, and the sealable layer 8 has apertures above positions between the plurality of light receiving portions 1. The sealable layer 8 is formed by, for example, an organic material of hydroxystyrene resin. Although photolithography is used to form the sealable layer 8 in the example of the present embodiment, the present invention is not limited to this format. For example, an organic material layer may be formed on the color filter layers 5 to 7, and a resist for opening the boundary portions of the color filter layers 5 to 7 may be formed on the organic material layer. Apertures may be formed on the organic material layer by etching using the resist as a mask to form the sealable layer 8.

Figure 1E:
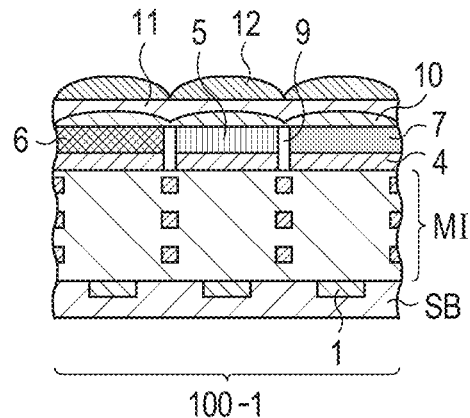
Figure 1C:
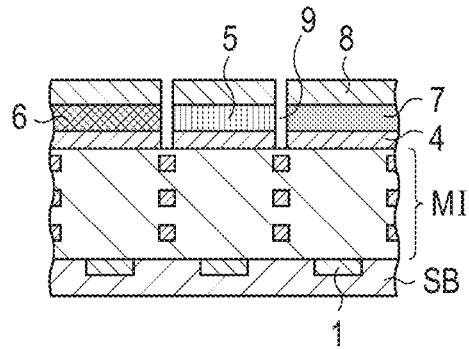

As illustrated in FIG. 1C, the aperture regions of the sealable layer 8 in the color filter layers 5 to 7 and the first planarized layer 4 are etched by anisotropic etching using the sealable layer 8 as a mask. As a result, hollow portions (air gaps) 9 are formed on side surfaces of the color filter layers 5 to 7. An example of a condition of the anisotropic etching illustrated in FIG. 1C includes $O_2/CO/N_2=5/80/40$ [sccm]. Although the layer for stopping the etching is the interlayer insulation layer 3 in the example illustrated in FIG. 1C, the present embodiment is not limited to this format.

In the present embodiment, the thickness of the sealable layer 8 is larger than the aperture width of the sealable layer 8. As a result, the thickness of the sealable layer 8 is larger (thicker) than the width of the hollow portions 9. The reason for forming the sealable layer 8 in this way is that sealing is not possible by overhanging in the next step illustrated in FIG. 1D if the thickness of the sealable layer 8 is not larger than the width of the hollow portions 9 on some level.

As illustrated in FIG. 1D, the sealable layer 8 is heated and softened to overhang the sealable layer 8 at the aperture regions of the hollow portions 9 (connect the mutually adjacent sealable layers 8 in the example of FIG. 1D) to form a sealing layer 10 for sealing the hollow portions 9. The heating temperature of the sealable layer 8 can be, for example, 110-250° C., and the heating temperature is 200° C. in the present embodiment.

As illustrated in FIG. 1E, a second planarized layer 11 is formed on the sealing layer 10. The second planarized layer 11 is formed by, for example, an organic material such as acrylic resin. As illustrated in FIG. 1E, micro lenses 12 are formed on the second planarized layer 11, at regions above the light receiving portions 1. The micro lenses 12 are formed by, for example, a material such as acrylic resin.

Although the second planarized layer 11 is arranged in the example illustrated in FIG. 1, the present embodiment is not limited to this format. For example, the micro lenses may be integrally formed by the configurations illustrated by reference numerals 11 and 12.

A solid-state imaging apparatus (solid-state imaging device) 100-1 including a plurality of pixels having the light receiving portions 1, the pixels arranged for example in a two-dimensional matrix, is created through the steps of FIGS. 1A to 1E.

In the first embodiment, the sealable layer 8 for opening the boundary portions of the color filter layers 5 to 7 as hollow portion forming layers are formed on the color filter layers 5 to 7, and the hollow portions 9 are formed on the side surfaces of the color filter layers 5 to 7 by etching using the sealable layer 8 as a mask. The first planarized layer 4 may be included as a hollow portion forming layer in addition to the color filter layers 5 to 7 as illustrated in FIGS. 1A to 1E. The sealable layer 8 is heated and softened to connect the mutually adjacent sealable layers to seal the aperture regions of the hollow portions 9.

According to the configuration, the sealable layer 8 is used as a mask for forming the hollow portions 9 by etching and is used as a sealing layer for sealing the apertures of the hollow portions 9. The sealable layer 8 is heated and softened to seal the hollow portions 9. This can realize the simplification of the process of forming the hollow portions in the solid-state imaging apparatus.

Since the sealable layer 8 is formed by an organic material as with the color filter layers 5 to 7 in the first embodiment, the sealable layer can be a layer with a refractive index close to that of the color filter layers, compared to when the sealable layer is formed by an inorganic material such as a silicon nitride film. This can suppress the reflection at interfaces between the sealable layer and the color filter layers and suppress the reduction in the sensor sensitivity caused by the degradation in the use efficiency of light.

In the first embodiment, the sealable layer 8 is heated and softened, and the heating temperature in sealing the hollow portions 9 is about 250° C. at most. Therefore, generation of particles caused by sublimation of organic material components such as color filter layers can be suppressed, and defects of sensors can be reduced.

Second Embodiment

A second embodiment of the present invention will be described.

FIGS. 2A to 2G are schematic diagrams illustrating an example of a manufacturing method of a solid-state imaging apparatus (solid-state imaging device) according to a second embodiment of the present invention. In FIGS. 2A to 2G, the same configurations as the configurations illustrated in FIGS. 1A to 1E are designated with the same reference numerals.

Figure 2A:
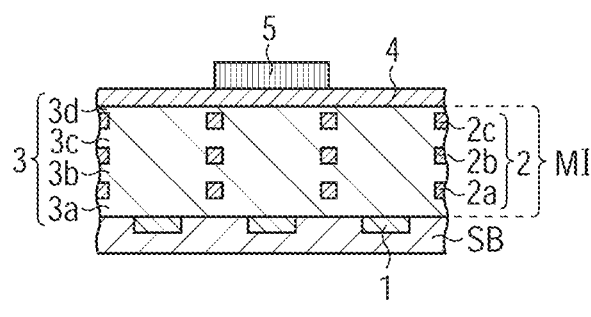
FIGS. 2A, 2B, 2C, 2D, 2E, 2F and 2G are schematic diagrams illustrating an example of a manufacturing method of a solid-state imaging apparatus (solid-state imaging device) according to a second embodiment of the present invention.

FIG. 2A will be described.

The configuration of the first planarized layer 4 and below in FIG. 2A is the same as that of FIG. 1A in the first embodiment, and the description will not be repeated.

After the first planarized layer 4 is formed, photolithography is used to form the first color filter layer 5 on the first planarized layer 4, at a region above the light receiving portion 1 positioned at the center of FIG. 2A, as illustrated in FIG. 2A.

Figure 2E:
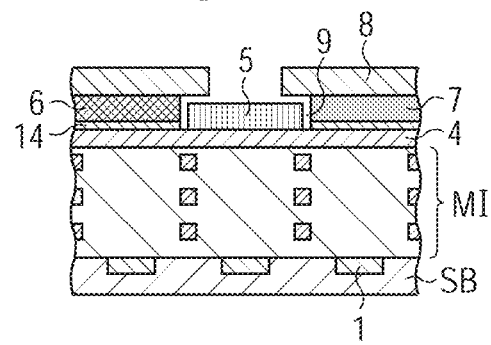
Figure 2B:
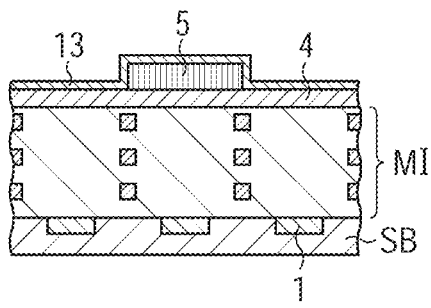

A thin sacrificial layer 13 is formed on the entire surface including the upper and side surfaces of the first color filter layer 5 as illustrated in FIG. 2B. The sacrificial layer 13 is a layer for forming hollow portions between the color filter layers. A material with an etching rate different from that of the material of the color filter layers is used for the sacrificial layer 13. For example, an inorganic material, such as silicon oxide ($SiO_2$) and silicon nitride (SiN), is used. In the present example, a layer made of a silicon oxide film is applied as the sacrificial layer 13. The deposition temperature can be 250° C. or less, and the film thickness can be 200 nm or less. In the present embodiment, the deposition temperature is 200° C., and the film thickness is 94 nm.

Figure 2F:
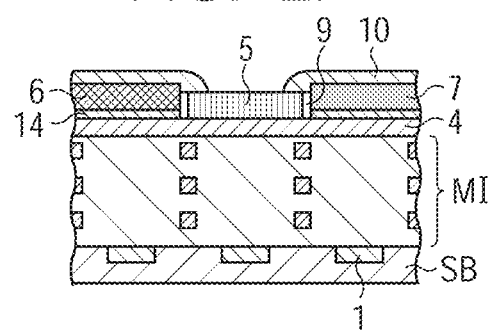
Figure 2C:
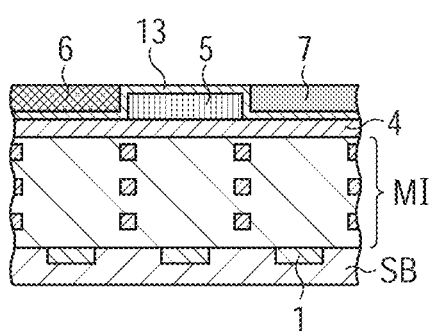

As illustrated in FIG. 2C, photolithography is used to form the second color filter layer 6 on the sacrificial layer 13, at a region above the light receiving portion 1 positioned on the left side of FIG. 2C. As illustrated in FIG. 2C, photolithography is used to form the third color filter layer 7 on the sacrificial layer 13, at a region above the light receiving portion 1 positioned on the right side of FIG. 2C. As illustrated in FIG. 2C, the second and third color filter layers 6 and 7 are formed so that the height of the upper surfaces is substantially the same as the height of the upper surface of the sacrificial layer 13 formed on the upper surface of the first color filter layer 5. More specifically, the color filter layers 5 to 7 have substantially the same film thickness in the example illustrated in FIG. 2C. However, the film thickness may be different.

Figure 2G:
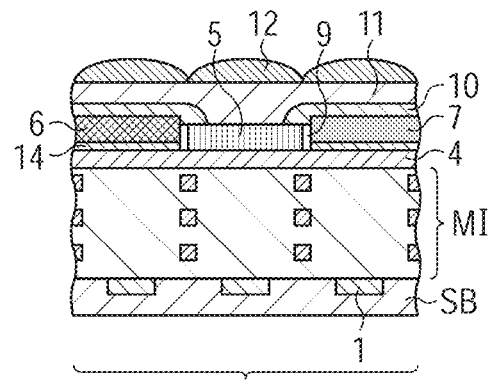
Figure 2D:
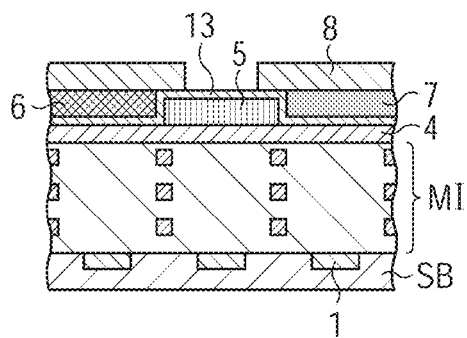

As illustrated in FIG. 2D, the sealable layer 8 is formed on the second and third color filter layers 6 and 7 and on the sacrificial layer 13, at regions partially covering over the first color filter layer 5. More specifically, the sealable layer 8 is formed to partially open the upper part of the first color filter layer 5. Although photolithography is used to form the sealable layer 8 in the example of the present embodiment, the present invention is not limited to this format. For example, an organic material layer may be formed on the second and third color filter layers 6 and 7 and on the sacrificial layer 13, and a resist for partially opening the upper part of the first color filter layer 5 may be formed on the organic material layer. An aperture may be formed on the organic material layer by etching using the resist as a mask to form the sealable layer 8.

As illustrated in FIG. 2E, the sacrificial layer 13 formed on the upper and side surfaces of the first color filter layer 5 is removed by, for example, wet etching, and the hollow portions 9 are formed between the color filter layers 5 to 7. In this case, a sacrificial remaining film layer 14 remains between the second color filter layer 6 and the first planarized layer 4 and between the third color filter layer 7 and the first planarized layer 4. Although the wet etching is applied to etch the sacrificial layer 13 in the present example, dry etching may be used.

In the present embodiment, the thickness of the sealable layer 8 is greater than the thickness of the sacrificial layer 13. As a result, the thickness of the sealable layer 8 is larger (thicker) than the width of the hollow portions 9.

As illustrated in FIG. 2F, the sealable layer 8 is heated and softened to form the sealing layer 10 for sealing the hollow portions 9. The heating temperature of the sealable layer 8 can be, for example, 110-250° C., and the heating temperature is 200° C. in the present embodiment.

As illustrated in FIG. 2G, the second planarized layer 11 is formed on the sealing layer 10 and the first color filter layer 5.

As illustrated in FIG. 2G, the micro lenses 12 are formed on the second planarized layer 11, above the positions of the light receiving portions 1.

Although the second planarized layer 11 is arranged in the example illustrated in FIGS. 2A to 2G, the present embodiment is not limited to this format. For example, the micro lenses may be integrally formed by the configurations illustrated by reference numerals 11 and 12.

A solid-state imaging apparatus (solid-state imaging device) 100-2 including a plurality of pixels having the light receiving portions 1, the pixels arranged for example in a two-dimensional matrix, is created through the steps of FIGS. 2A to 2G.

In the second embodiment, the color filter layer 5 as a predetermined hollow portion forming layer is formed above the semiconductor substrate SB, above a position of a predetermined light receiving portion (light receiving portion 1 positioned at the center in the example illustrated in FIGS. 2A to 2G) among the plurality of light receiving portions 1. The sacrificial layer 13 is formed on the upper and side surfaces of the color filter layer 5 (predetermined hollow portion forming layer). The color filter layers 6 and 7 as other hollow portion forming layers are formed at regions above other light receiving portions (light receiving portions 1 positioned on the left and right sides in the example illustrated in FIGS. 2A to 2G) adjacent to the predetermined light receiving portion, and the side surfaces of the color filter layers 6 and 7 contact with the sacrificial layer 13. The sealable layer 8 is formed on the color filter layers 6 and 7 (other hollow portion forming layers) and on the sacrificial layer, at regions partially covering over the color filter layer 5 (predetermined hollow portion forming layer). The sacrificial layer 13 formed on the upper and side surfaces of the color filter layer 5 (predetermined hollow portion forming layer) is removed by etching to form the hollow portions 9. The sealable layer 8 is heated and softened to connect the sealable layer 8 and the color filter layer 5 (predetermined hollow portion forming layer) to seal the aperture regions of the hollow portions 9.

According to the configuration, the sealable layer 8 is heated and softened to seal the hollow portions 9. This can realize the simplification of the process of forming the hollow portions in the solid-state imaging apparatus.

In the second embodiment, the sealable layer 8 is heated and softened, and the heating temperature in sealing the hollow portions 9 is about 250° C. at most. Therefore, generation of particles caused by sublimation of organic material components such as color filter layers can be suppressed, and defects of sensors can be reduced.

Third Embodiment

A third embodiment of the present invention will be described.

FIGS. 3A to 3I are schematic diagrams illustrating an example of a manufacturing method of a solid-state imaging apparatus (solid-state imaging device) according to a third embodiment of the present invention. In FIGS. 3A to 3I, the same configurations as the configurations illustrated in FIGS. 1A to 2G are designated with the same reference numerals.

Figure 3A:
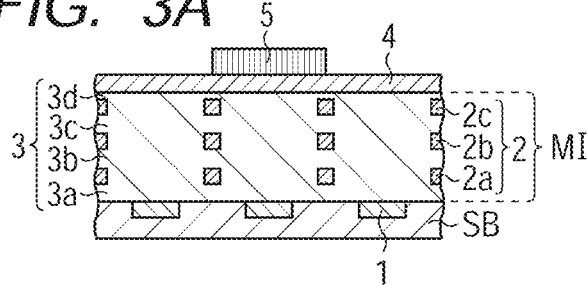
FIGS. 3A, 3B, 3C, 3D, 3E, 3F, 3G, 3H and 3I are schematic diagrams illustrating an example of a manufacturing method of a solid-state imaging apparatus (solid-state imaging device) according to a third embodiment of the present invention.

FIG. 3A will be described.

In FIG. 3A, the configuration of the first planarized layer 4 and below is the same as that of FIG. 1A in the first embodiment, and the description will not be repeated.

After the first planarized layer 4 is formed, photolithography is used to form the first color filter layer 5 on the first planarized layer 4, at a region above the light receiving portion 1 positioned at the center of FIG. 3A, as illustrated in FIG. 3A.

Figure 3F:
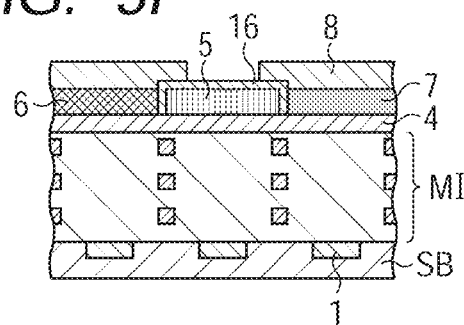
Figure 3B:
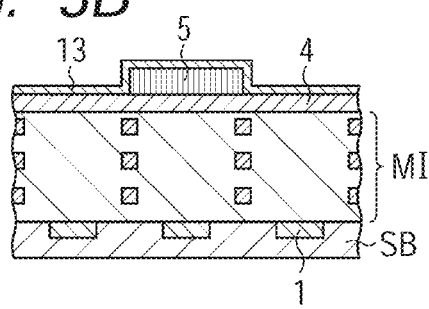

As illustrated in FIG. 3B, the thin sacrificial layer 13 is formed on the entire surface including the upper and side surfaces of the first color filter layer 5. The sacrificial layer 13 is a layer for forming hollow portions between the color filter layers. A material with an etching rate different from that of the material of the color filter layers is used for the sacrificial layer 13. For example, an inorganic material, such as silicon oxide ($SiO_2$) and silicon nitride (SiN), is used. In the present example, a layer made of a silicon oxide film is applied as the sacrificial layer 13. The deposition temperature can be 250° C. or less, and the film thickness can be 200 nm or less. In the present embodiment, the deposition temperature is 200° C., and the film thickness is 94 nm.

Figure 3G:
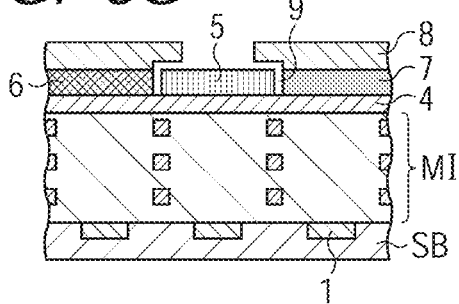
Figure 3C:
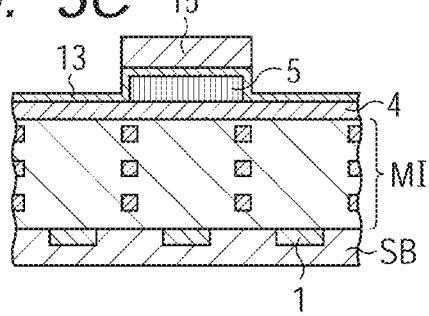

As illustrated in FIG. 3C, a photoresist 15 is formed on the sacrificial layer 13 deposited on the upper and side surfaces of the first color filter layer 5.

Figure 3H:
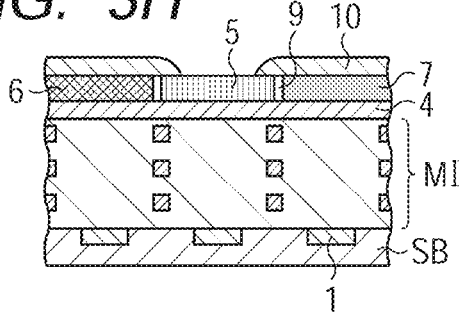
Figure 3D:
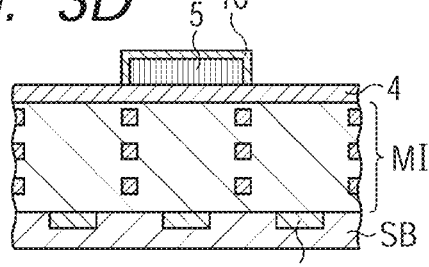

As illustrated in FIG. 3D, the sacrificial layer 13 in regions other than the regions of the upper and side surfaces of the first color filter layer 5 is removed by etching using the photoresist 15 as a mask. As a result, a sacrificial layer 16 remains on the upper and side surfaces of the first color filter layer 5. The photoresist 15 is removed by asking.

Figure 3I:
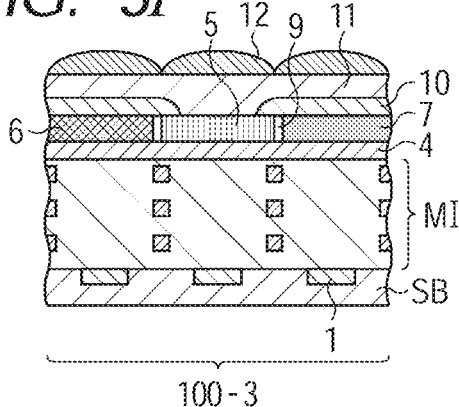
Figure 3E:
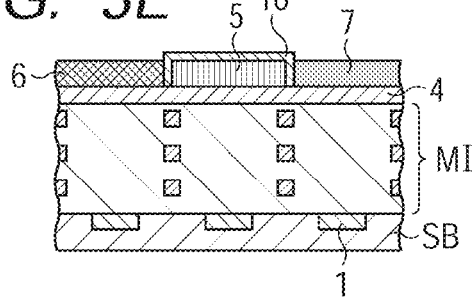

As illustrated in FIG. 3E, photolithography is used to form the second color filter layer 6 on the first planarized layer 4, at a region above the light receiving portion 1 positioned on the left side of FIG. 3E. As illustrated in FIG. 3E, photolithography is used to form the third color filter layer 7 on the first planarized layer 4, at a region above the light receiving portion 1 positioned on the right side of FIG. 3E. Although the second and third color filter layers 6 and 7 have substantially the same film thickness as that of the first color filter layer 5 in the example illustrated in FIG. 3E, the film thickness may be different.

As illustrated in FIG. 3F, the sealable layer 8 is formed on the second and third color filter layers 6 and 7 and on the sacrificial layer 16, at regions partially covering over the first color filter layer 5. More specifically, the sealable layer 8 is formed to partially open the upper part of the first color filter layer 5. Although photolithography is used to form the sealable layer 8 in the example of the present embodiment, the present invention is not limited to this format. For example, an organic material layer may be formed on the second and third color filter layers 6 and 7 and on the sacrificial layer 16, and a resist for partially opening the upper part of the first color filter layer 5 may be formed on the organic material layer. An aperture may be formed on the organic material layer by etching using the resist as a mask to form the sealable layer 8.

As illustrated in FIG. 3G, the sacrificial layer 16 formed on the upper and side surfaces of the first color filter layer 5 is removed by, for example, wet etching, and the hollow portions 9 are formed between the color filter layers 5 to 7. Although the wet etching is applied to etch the sacrificial layer 16 in the present example, dry etching may be used.

In the present embodiment, the thickness of the sealable layer 8 is greater than the thickness of the sacrificial layer 16. As a result, the thickness of the sealable layer 8 is larger (thicker) than the width of the hollow portions 9.

As illustrated in FIG. 3H, the sealable layer 8 is heated and softened to form the sealing layer 10 for sealing the hollow portions 9. The heating temperature of the sealable layer 8 can be, for example, 110-250° C., and the heating temperature is 200° C. in the present embodiment.

As illustrated in FIG. 3I, the second planarized layer 11 is formed on the sealing layer 10 and the first color filter layer 5.

As illustrated in FIG. 3I, the micro lenses 12 are formed on the second planarized layer 11, above the positions of the light receiving portions 1.

Although the second planarized layer 11 is arranged in the example illustrated in FIGS. 3A to 3I, the present embodiment is not limited to this format. For example, the micro lenses may be integrally formed by the configurations illustrated by reference numerals 11 and 12.

A solid-state imaging apparatus (solid-state imaging device) 100-3 including a plurality of pixels having the light receiving portions 1, the pixels arranged for example in a two-dimensional matrix, is created through the steps of FIGS. 3A to 3I.

In the third embodiment, the color filter layer 5 as a predetermined hollow portion forming layer is formed above the semiconductor substrate SB, above a position of a predetermined light receiving portion (light receiving portion 1 positioned at the center in the example illustrated in FIGS. 3A to 3I) among the plurality of light receiving portions 1. The sacrificial layer 16 is formed on the upper and side surfaces of the color filter layer 5 (predetermined hollow portion forming layer). The color filter layers 6 and 7 as other hollow portion forming layers are formed at regions above other light receiving portions (light receiving portions 1 positioned on the left and right sides in the example illustrated in FIGS. 3A to 3I) adjacent to the predetermined light receiving portion, and the side surfaces of the color filter layers 6 and 7 contact with the sacrificial layer 16. The sealable layer 8 is formed on the color filter layers 6 and 7 (on other hollow portion forming layers) and on the sacrificial layer, at regions partially covering over the color filter layer 5 (predetermined hollow portion forming layer). The sacrificial layer 16 formed on the upper and side surfaces of the color filter layer 5 (predetermined hollow portion forming layer) is removed by etching to form the hollow portions 9. The sealable layer 8 is heated and softened to connect the sealable layer 8 and the color filter layer 5 (predetermined hollow portion forming layer) to seal the aperture regions of the hollow portions 9.

According to the configuration, the sealable layer 8 is heated and softened to seal the hollow portions 9. This can realize the simplification of the process of forming the hollow portions in the solid-state imaging apparatus.

In the third embodiment, the sealable layer 8 is heated and softened, and the heating temperature in sealing the hollow portions 9 is about 250° C. at most. Therefore, generation of particles caused by sublimation of organic material components such as color filter layers can be suppressed, and defects of sensors can be reduced.

Fourth Embodiment

A fourth embodiment of the present invention will be described.

FIGS. 4A to 4H are schematic diagrams illustrating an example of a manufacturing method of a solid-state imaging apparatus (solid-state imaging device) according to a fourth embodiment of the present invention. In FIGS. 4A to 4H, the same configurations as the configurations illustrated in FIGS. 1A to 2G are designated with the same reference numerals.

Figure 4A:
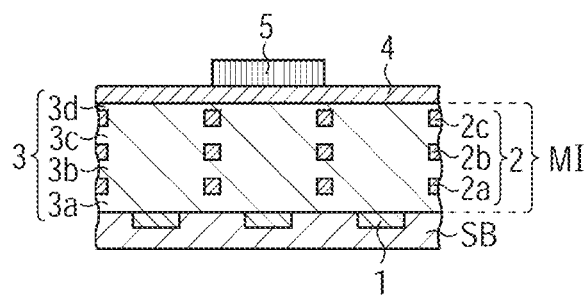
FIGS. 4A, 4B, 4C, 4D, 4E, 4F, 4G and 4H are schematic diagrams illustrating an example of a manufacturing method of a solid-state imaging apparatus (solid-state imaging device) according to a fourth embodiment of the present invention.

FIG. 4A will be described.

In FIG. 4A, the configuration of the first planarized layer 4 and below is the same as that of FIG. 1A in the first embodiment, and the description will not be repeated.

After the first planarized layer 4 is formed, photolithography is used to form the first color filter layer 5 on the first planarized layer 4, at a region above the light receiving portion 1 positioned at the center of FIG. 4A, as illustrated in FIG. 4A.

Figure 4E:
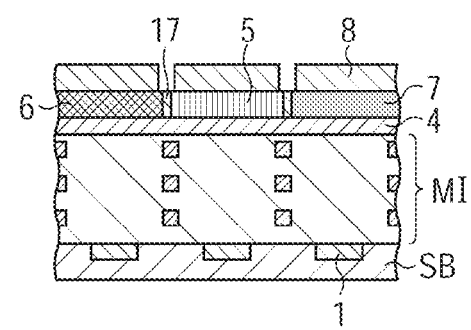
Figure 4B:
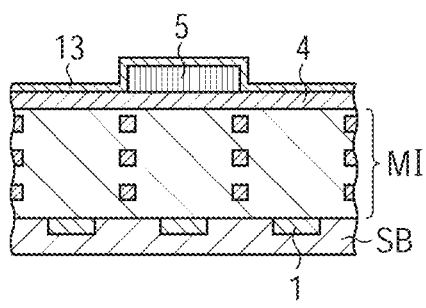

As illustrated in FIG. 4B, the thin sacrificial layer 13 is formed on the entire surface including the upper and side surfaces of the first color filter layer 5. The sacrificial layer 13 is a layer for forming hollow portions between the color filter layers. A material with an etching rate different from that of the material of the color filter layers is used for the sacrificial layer 13. For example, an inorganic material, such as silicon oxide ($SiO_2$) and silicon nitride (SiN), is used. In the present example, a layer made of a silicon oxide film is applied as the sacrificial layer 13. The deposition temperature can be 250° C. or less, and the film thickness can be 200 nm or less. In the present embodiment, the deposition temperature is 200° C., and the film thickness is 94 nm.

Figure 4F:
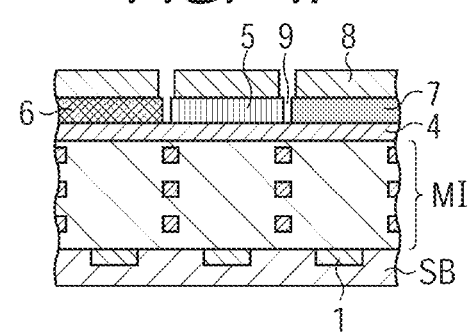
Figure 4C:
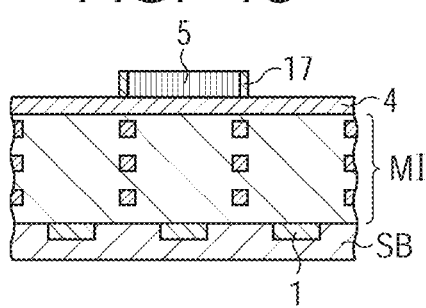

As illustrated in FIG. 4C, the sacrificial layer 13 is etched back using anisotropic dry etching to remove the sacrificial layer 13 in regions other than the regions on the side surfaces of the first color filter layer 5. As a result, sacrificial layers 17 remain on the side surfaces of the first color filter layer 5.

Figure 4G:
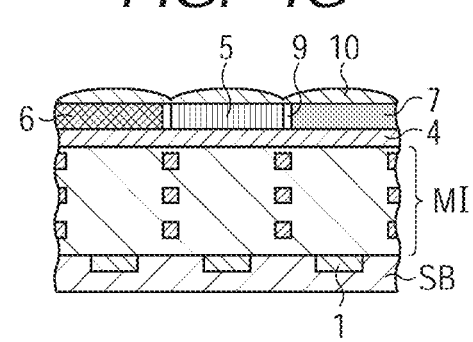
Figure 4D:
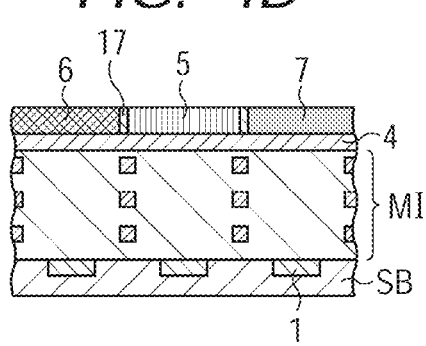

As illustrated in FIG. 4D, photolithography is used to form the second color filter layer 6 on the first planarized layer 4, at a region above the light receiving portion 1 positioned on the left side of FIG. 4D. As illustrated in FIG. 4D, photolithography is used to form the third color filter layer 7 on the first planarized layer 4, at a region above the light receiving portion 1 positioned on the right side of FIG. 4D. Although the second and third color filter layers 6 and 7 have substantially the same film thickness as that of the first color filter layer 5 in the example illustrated in FIG. 4D, the film thickness may be different.

As illustrated in FIG. 4E, the sealable layer 8 is formed on the color filter layers 5 to 7. More specifically, the sealable layer 8 is formed to open the regions above the sacrificial layers 17 as illustrated in FIG. 4E. Although photolithography is used to form the sealable layer 8 in the example of the present embodiment, the present invention is not limited to this format. For example, an organic material layer may be formed on the color filter layers 5 to 7 and on the sacrificial layers 17, and a resist for opening the regions above the sacrificial layers 17 may be formed on the organic material layer. An aperture may be formed on the organic material layer by etching using the resist as a mask to form the sealable layer 8. Although the sealable layer 8 opens all regions above the sacrificial layers 17 in the example illustrated in FIG. 4E, the sealable layer 8 may open part of the regions above the sacrificial layer 17, for example.

As illustrated in FIG. 4F, the sacrificial layers 17 formed on the side surfaces of the first color filter layer 5 (between the color filter layers 5 to 7) are removed by, for example, wet etching, and the hollow portions 9 are formed between the color filter layers 5 to 7. Although the wet etching is applied to etch the sacrificial layers 17 in the present example, dry etching may be used.

In the present embodiment, the thickness of the sealable layer 8 is greater than the thickness of the sacrificial layers 17. As a result, the thickness of the sealable layer 8 is larger (thicker) than the width of the hollow portions 9.

As illustrated in FIG. 4G, the sealable layer 8 is heated and softened to overhang the sealable layer 8 at the aperture regions of the hollow portions 9 (connect mutually adjacent sealable layers 8 in the example of FIG. 4G) to form the sealing layer 10 for sealing the hollow portions 9. The heating temperature of the sealable layer 8 can be, for example, 110-250° C., and the heating temperature is 200° C. in the present embodiment.

Figure 4H:
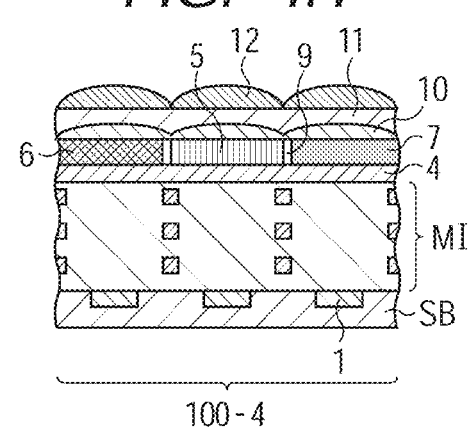

As illustrated in FIG. 4H, the second planarized layer 11 is formed on the sealing layer 10.

As illustrated in FIG. 4H, the micro lenses 12 are formed on the second planarized layer 11, above the positions of the light receiving portions 1.

Although the second planarized layer 11 is arranged in the example illustrated in FIGS. 4A to 4H, the present embodiment is not limited to this format. For example, the micro lenses may be integrally formed by the configurations illustrated by reference numerals 11 and 12.

A solid-state imaging apparatus (solid-state imaging device) 100-4 including a plurality of pixels having the light receiving portions 1, the pixels arranged for example in a two-dimensional matrix, is created through the steps of FIGS. 4A to 4H.

In the fourth embodiment, the color filter layer 5 as a predetermined hollow portion forming layer is formed above the semiconductor substrate SB, above a position of a predetermined light receiving portion (light receiving portion 1 positioned at the center in the example illustrated in FIGS. 4A to 4H) among the plurality of light receiving portions 1. The sacrificial layers 17 are formed on the side surfaces of the color filter layer 5 (predetermined hollow portion forming layer). The color filter layers 6 and 7 as other hollow portion forming layers are formed at regions above other light receiving portions (light receiving portions 1 positioned on the left and right sides in the example illustrated in FIGS. 4A to 4H) adjacent to the predetermined light receiving portion, and the side surfaces of the color filter layers 6 and 7 contact with the sacrificial layers 17. The sealable layer 8 is formed on the color filter layer 5 (on the predetermined hollow portion forming layer) and on the color filter layers 6 and 7 (on other hollow portion forming layers). The sacrificial layers 17 are removed by etching to form the hollow portions 9. The sealable layer 8 is heated and softened to connect the mutually adjacent sealable layers to seal the aperture regions of the hollow portions 9.

According to the configuration, the sealable layer 8 is heated and softened to seal the hollow portions 9. This can realize the simplification of the process of forming the hollow portions in the solid-state imaging apparatus.

In the fourth embodiment, the sealable layer 8 is heated and softened, and the heating temperature in sealing the hollow portions 9 is about 250° C. at most. Therefore, generation of particles caused by sublimation of organic material components such as color filter layers can be suppressed, and defects of sensors can be reduced.

Fifth Embodiment

A fifth embodiment of the present invention will be described.

FIGS. 5A to 5F are schematic diagrams illustrating an example of a manufacturing method of a solid-state imaging apparatus (solid-state imaging device) according to a fifth embodiment of the present invention.

In FIGS. 5A to 5F, the same configurations as the configurations illustrated in FIGS. 1A to 1E are designated with the same reference numerals.

Figure 5A:
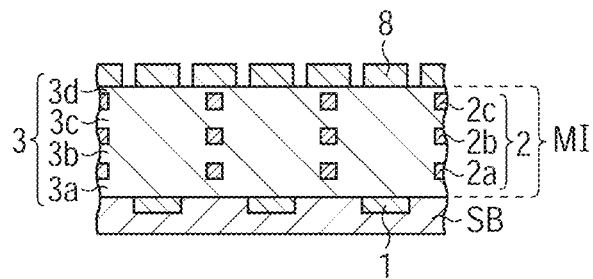
FIGS. 5A, 5B, 5C, 5D, 5E and 5F are schematic diagrams illustrating an example of a manufacturing method of a solid-state imaging apparatus (solid-state imaging device) according to a fifth embodiment of the present invention.

FIG. 5A will be described.

In FIG. 5A, the configuration of the multi-layer wiring structure MI and below, the multi-layer wiring structure MI including the wiring layers 2 and the interlayer insulation layers 3, is the same as that of FIG. 1A in the first embodiment, and the description will not be repeated.

After the multi-layer wiring structure MI is formed, the sealable layer 8 for opening the regions above both sides of the light receiving portions 1 is formed on the upper surface of the multi-layer wiring structure MI (fourth interlayer insulation layer 3*d*), as illustrated in FIG. 5A. More specifically, the sealable layer 8 is formed on the upper surface of the multi-layer wiring structure MI, and the sealable layer 8 has apertures above the positions between the plurality of light receiving portions 1. In the present embodiment, although photolithography is used to form the sealable layer 8 for example, the present invention is not limited to this format. For example, an organic material layer may be formed on the upper surface of the multi-layer wiring structure MI, and a resist for opening the regions above both sides of the light receiving portions 1 may be formed on the organic material layer. Apertures may be formed on the organic material layer by etching using the resist as a mask to form the sealable layer 8.

Figure 5D:
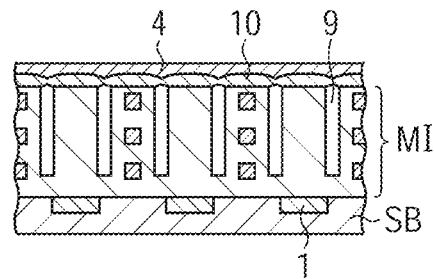
Figure 5B:
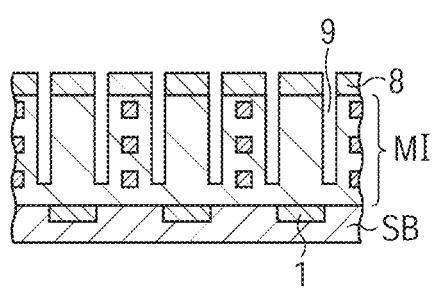

As illustrated in FIG. 5B, the aperture regions of the sealable layer 8 in the interlayer insulation layers 3 are etched by anisotropic etching using the sealable layer 8 as a mask. As a result, the hollow portions 9 are formed in the interlayer insulation layers 3, at the regions above both sides of the light receiving portions 1.

In the present embodiment, the thickness of the sealable layer 8 is greater than the aperture width of the sealable layer 8. As a result, the thickness of the sealable layer 8 is larger (thicker) than the width of the hollow portions 9.

Figure 5E:
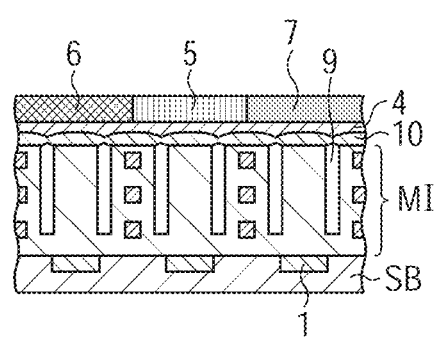
Figure 5C:
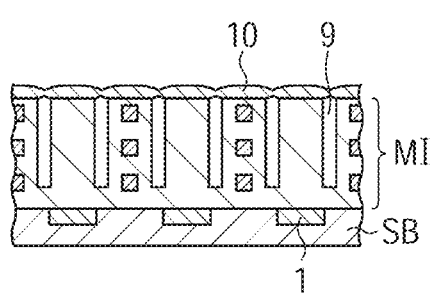

As illustrated in FIG. 5C, the sealable layer 8 is heated and softened to overhang the sealable layer 8 at the aperture regions of the hollow portions 9 (connect mutually adjacent sealable layers 8 in the example of FIG. 5C) to form the sealing layer 10 for sealing the hollow portions 9. The heating temperature of the sealable layer 8 can be, for example, 110-400° C. (furthermore, can be 250° C. or less), and the heating temperature is 200° C. in the present embodiment.

As illustrated in FIG. 5D, the first planarized layer 4 is formed on the sealing layer 10.

As illustrated in FIG. 5E, photolithography is used to form the first color filter layer 5, the second color filter layer 6 and the third color filter layer 7 on the first planarized layer 4.

Figure 5F:
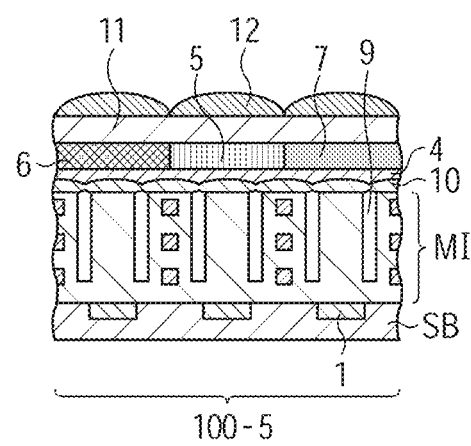

As illustrated in FIG. 5F, the second planarized layer 11 is formed on the color filter layers 5 to 7.

As illustrated in FIG. 5F, the micro lenses 12 are formed on the second planarized layer 11.

Although the second planarized layer 11 is arranged in the example illustrated in FIGS. 5A to 5F, the present embodiment is not limited to this format. For example, the micro lenses may be integrally formed by the configurations illustrated by reference numerals 11 and 12.

A solid-state imaging apparatus (solid-state imaging device) 100-5 including a plurality of pixels having the light receiving portions 1, the pixels arranged for example in a two-dimensional matrix, is created through the steps of FIGS. 5A to 5F.

In the fifth embodiment, the sealable layer 8 for opening the regions above both sides of the light receiving portions 1 is formed on the interlayer insulation layers 3 as hollow portion forming layers, and the hollow portions 9 are formed at the aperture regions of the sealable layer 8 in the interlayer insulation layers 3 by etching using the sealable layer 8 as a mask. The sealable layer 8 is heated and softened to connect the mutually adjacent sealable layers to seal the aperture regions of the hollow portions 9.

According to the configuration, the sealable layer 8 is used as a mask in forming the hollow portions 9 by etching, and the sealable layer 8 is used as a sealing layer that seals the apertures of the hollow portions 9. The sealable layer 8 is heated and softened to seal the hollow portions 9. This can realize the simplification of the process of forming the hollow portions in the solid-state imaging apparatus.

Other Embodiments

For example, in the solid-state imaging apparatuses (solid-state imaging devices) 100 according to the first to fourth embodiments, inner lenses (lenses in layer) may be arranged between the multi-layer wiring structure MI (interlayer insulation layers 3) and the first planarized layer 4, at regions above the light receiving portions 1. For example, convex inner lenses made of silicon nitride are arranged. As a result of the arrangement of the inner lenses, the light collecting efficiency of the light receiving portions 1 can be improved by combining the inner lenses and the micro lenses 12.

In the solid-state imaging apparatuses (solid-state imaging devices) 100 according to the first to fifth embodiments, waveguides (optical waveguides) that penetrate through the interlayer insulation layers 3 to contact with the light receiving portions 1 may be arranged in the interlayer insulation layers 3, for example. More specifically, waveguides may be arranged on the light receiving portions. For example, waveguides made of silicon nitride are arranged. As a result of the arrangement of the waveguides, the light collecting efficiency of the light receiving portions 1 can be improved.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-005543, filed Jan. 16, 2013, which is hereby incorporated by reference herein in its entirety.

What is claimed is:

1. A manufacturing method of a solid-state imaging apparatus having a semiconductor substrate having a plurality of light receiving portions, the method comprising:
    forming a color filter layer above the semiconductor substrate;
    forming a sealable layer having a plurality of apertures on the color filter layer;
    forming a plurality of air gap portions in the color filter layer above a position between ones of the plurality of light receiving portions; and
    heating the sealable layer, to form a sealing layer sealing an upper portion of the air gap portion with a material of the sealable layer without filling the plurality of air gap portions with the material of the sealable layer.

2. The manufacturing method according to claim 1, wherein:
    the plurality of apertures of the sealable layer are formed above the position between the ones of the plurality of light receiving portions,
    the plurality of air gap portions are formed by etching the color filter layer using the sealable layer as a mask, and
    during the heating of the sealable layer to form the sealing layer, the upper portion of the air gap portion is sealed with the material of the sealable layer by connecting mutually adjacent parts of the sealable layer.

3. The manufacturing method according to claim 1, wherein:
    the sealable layer is formed from an organic material, and
    the heating of the sealable layer is conducted at a temperature of 110-250° C.

4. The manufacturing method according to claim 1, wherein, the sealable layer has a thickness larger than a width of an air gap portion.

5. The manufacturing method according to claim 1, further comprising forming a micro lens above each of the plurality of light receiving portions.

6. The manufacturing method according to claim 1, further comprising forming a waveguide above each of the plurality of light receiving portions.

7. The manufacturing method according to claim 1, further comprising forming an inner lens above each of the plurality of light receiving portions.

8. A manufacturing method of a solid-state imaging apparatus having a semiconductor substrate having a plurality of light receiving portions, the method comprising:
    forming a first color filter layer above the semiconductor substrate and above a first light receiving portion;
    forming a sacrificial layer on an upper surface and a side surface of the first color filter layer; and forming a second color filter layer contacting the sacrificial layer above a second light receiving portion adjacent to the first light receiving portion above the semiconductor substrate;

forming, on the first and second color filter layers, a sealable layer having an aperture exposing the sacrificial layer formed on an upper surface of the first color filter layer;

forming an air gap portion between the first and second color filter layers, by etching to remove the sacrificial layer through the aperture of the sealable layer; and heating the sealable layer, to form a sealing layer sealing an upper portion of the air gap portion with a material of the sealable layer without filling the air gap portion with the material of the sealable layer.

9. The manufacturing method according to claim 8, wherein:
the sealable layer is formed from an organic material, and
the heating of the sealable layer is conducted at a temperature of 110-250° C.

10. The manufacturing method according to claim 8, wherein the sealable layer has a thickness larger than a width of an air gap portion.

11. The manufacturing method according to claim 8, further comprising forming a micro lens above each of the plurality of light receiving portions.

12. A manufacturing method of a solid-state imaging apparatus having a semiconductor substrate having a plurality of light receiving portions, the method comprising forming a first color filter layer above the semiconductor substrate and above a first light receiving portion;

forming a sacrificial layer on a side surface of the first color filter layer;

forming a second color filter layer contacting the sacrificial layer above a second light receiving portion adjacent to the first light receiving portion above the semiconductor substrate;

forming, on the first and second color filter layers, a sealable layer having an aperture exposing the sacrificial layer formed on an upper surface of the first color filter layer;

forming an air gap portion between the first and second color filter layers, by etching to remove the sacrificial layer through the aperture of the sealable layer; and heating the sealable layer, to form a sealing layer sealing an upper portion of the air gap portion with a material of the sealable layer without filling the air gap portion with the material of the sealable layer.

* * * * *